United States Patent
Lin et al.

(10) Patent No.: US 9,654,062 B2
(45) Date of Patent: May 16, 2017

(54) RETURN PATH NOISE REDUCING AMPLIFIER WITH BYPASS SIGNAL

(71) Applicant: PCT International, Inc., Mesa, AZ (US)

(72) Inventors: Kang Lin, Chandler, AZ (US); Jon-En Wang, Chandler, AZ (US)

(*) Notice: Subject to any disclaimer, the term of this patent is extended or adjusted under 35 U.S.C. 154(b) by 63 days.

(21) Appl. No.: 14/181,636

(22) Filed: Feb. 15, 2014

(65) Prior Publication Data

US 2014/0375381 A1 Dec. 25, 2014

Related U.S. Application Data

(60) Provisional application No. 61/839,369, filed on Jun. 25, 2013.

(51) Int. Cl.

| H03F 3/189 | (2006.01) |
| H03F 3/62 | (2006.01) |
| H03F 3/72 | (2006.01) |

(52) U.S. Cl.
CPC .............. *H03F 3/189* (2013.01); *H03F 3/62* (2013.01); *H03F 3/72* (2013.01); *H03F 2200/63* (2013.01); *H03F 2203/7239* (2013.01)

(58) Field of Classification Search
CPC .............. H04N 7/173; H04N 21/6168; H04N 21/2408; H04N 7/17309; H04N 7/102; H04N 7/17327; H03F 3/189; H03F 3/62; H03F 3/72; H03F 2200/63; H03F 2203/7239
USPC .......................... 725/124, 127, 106, 126, 121
See application file for complete search history.

(56) References Cited

U.S. PATENT DOCUMENTS

| 7,530,091 | B2 | 5/2009 | Vaughan | |
| 2003/0114112 | A1* | 6/2003 | Strater | H04N 7/102 455/67.11 |
| 2006/0015921 | A1* | 1/2006 | Vaughan | H04M 7/006 725/127 |
| 2009/0320085 | A1 | 12/2009 | Wang | |
| 2010/0125877 | A1* | 5/2010 | Wells | H04L 12/2801 725/78 |
| 2010/0223651 | A1 | 9/2010 | Wang | |
| 2011/0267143 | A1 | 11/2011 | Zilberberg | |
| 2013/0278353 | A1* | 10/2013 | Alkan | H03H 7/0138 333/175 |
| 2014/0033264 | A1 | 1/2014 | Li et al. | |

(Continued)

*Primary Examiner* — Nathan Flynn
*Assistant Examiner* — Caroline Somera
(74) *Attorney, Agent, or Firm* — Thomas W. Galvani, P.C.; Thomas W. Galvani

(57) ABSTRACT

An amplifier system an amplified path and a bypass path for carrying an RF signal. A switch in the amplified system routes the RF signal through the amplified path in response to a normal condition in the amplifier system, and routes the RF signal through the bypass path in response to an abnormal condition in the amplifier system. The amplified path includes an amplified forward circuit and a return circuit. The amplified forward circuit has an amplifier, and the return circuit has a return amplifier and detection circuitry for providing power to the return amplifier. The detection circuitry provides power to the return amplifier in response to a normal condition in the return circuit, and removes power from the return amplifier in response to an abnormal condition in the return circuit.

19 Claims, 3 Drawing Sheets

(56) References Cited

U.S. PATENT DOCUMENTS

2015/0007246 A1* 1/2015 Ariesen ............... H04N 21/239
                                                              725/127

* cited by examiner

RETURN PATH NOISE REDUCING AMPLIFIER WITH BYPASS SIGNAL

CROSS-REFERENCE TO RELATED APPLICATIONS

This application claims the benefit of U.S. Provisional Application No. 61/839,369, filed Jun. 25, 2013, which is hereby incorporated by reference.

FIELD OF THE INVENTION

The present invention relates generally to data communication electronics, and more particularly to home amplifiers for transmitting RF signals.

BACKGROUND OF THE INVENTION

In recent years, CATV operators have transformed their services from providing standard cable television entertainment content to providing television, voice, security, and broadband services, all through a single cable. As a result, modern communications infrastructures have had to meet rising demand by providing much larger amounts of bandwidth as both the number of subscribers have increased and the services those subscribers use have increasingly consumed more bandwidth. For instance, bandwidth-intensive internet applications such as file sharing, video conferencing, e-commerce, and audio and video consumption have become incredibly popular. To address this rising demand, some incumbent local exchange carriers and competitive local exchange carriers have completely replaced their networks with fiber-based technologies capable of carrying more data than conventional coaxial cable systems. However, infrastructure modifications are costly in both time and expense, and are therefore not an attractive solution to some carriers.

Some operators have attempted to satisfy the ever-increasing demand for bandwidth in other ways. For example, some operators have implemented higher modulation schemes for both forward path ("downstream") signals and return path ("upstream") signals. Currently, many CATV operators use 256 quadrature amplitude modulation ("QAM") for downstream or forward path signals, and are actively migrating from 16 QAM to 64 QAM for upstream or return path signals. Several return path signals from a single house are typically combined into a single upstream signal, which is then combined with many other similar signals from other homes, so that a combined upstream signal is transmitted to back to the operator.

Hybrid fiber-coaxial ("HFC") systems provide this bi-directional data transmission, with return path signals being transmitted to an HFC plant to provide information about the system, such as the operability, status, load, or use of the system and by the consumer. HFC networks transmit data using the cable service interface specification ("DOCSIS") standard for bi-directional data transmission. DOCSIS devices such as cable modems, embedded multimedia terminal adapters ("EMTAs"), and cable set-top boxes in a subscriber's home transmit return path data in periodic bursts. When the electronic device is not actively transmitting data, it is inactive. However, while the device is inactive and not transmitting a signal, noise, known as ingress noise, is still transmitted along the line from construction or installation imperfections in the electronic devices and cables, poor shielding in the devices and cables, distortions in devices and cables, and other sources. Further, as higher levels of modulation are used, the required signal to noise ratio ("SNR") increases. This means that the "good," or valid, signals originating from devices like cable modems, EMTAs, and cable set-top boxes must be at a sufficient power level above interfering noise to ensure good data transmission quality. Furthermore, the HFC network must provide a guaranteed level of service to ensure the quality of voice communications and to accommodate VoIP (Voice over Internet Protocol).

As a consequence of combining return path signals for transmission back to an HFC plant, return path ingress noise is combined and transmitted to the HFC plant. When ingress noise is combined from among many houses, a noise funneling effect is created which negatively impacts the SNR of the system and effectively sets the limit on the number of homes per node, as well as the highest modulation level that can be used. Conventional attempts by CATV operators to reduce ingress noise so that higher modulation levels can be used include reducing node sizes, which requires expensive HFC plant upgrades consisting of new optical fiber installation and capital equipment investment.

The VoIP services provided by CATV operators are of particular importance, because VoIP is used to provide telephone communications, which are critical or essential services in crises such as natural disasters or emergencies. While these services must be operational during crises, they typically rely on powered equipment and powered signals. That power can be disrupted or discontinued during crises. If an emergency or disaster results in the loss of power, the VoIP services will typically lost as well. An improved amplifier is needed.

SUMMARY OF THE INVENTION

An amplifier system according to the principle of the invention communicates an RF signal, reduces return path noise to the HFC plant, and transmits the RF signal between the HFC plant and the home even during a loss of power. The amplifier system includes an input connector, an output connector, an amplified path connecting the input and output connectors, and a bypass path connecting the input and output connectors. A switch routes the RF signal through either the amplified path or the bypass path; the switch routes the RF signal through the amplified path in response to a normal condition in the amplifier system, and routes the RF signal through the bypass path in response to an abnormal condition in the amplifier system.

The amplified path includes both an amplified forward circuit and a return circuit. The amplified forward circuit includes an amplifier for amplifying a downstream signal, and the return circuit includes a return amplifier and detection circuitry for providing power to the return amplifier. The detection circuity provides power to the return amplifier in response to a normal condition in the return circuit, and removes power from the return amplifier in response to an abnormal condition in the return circuit.

BRIEF DESCRIPTION OF THE DRAWINGS

Referring to the drawings.

DETAILED DESCRIPTION

Figure 1:
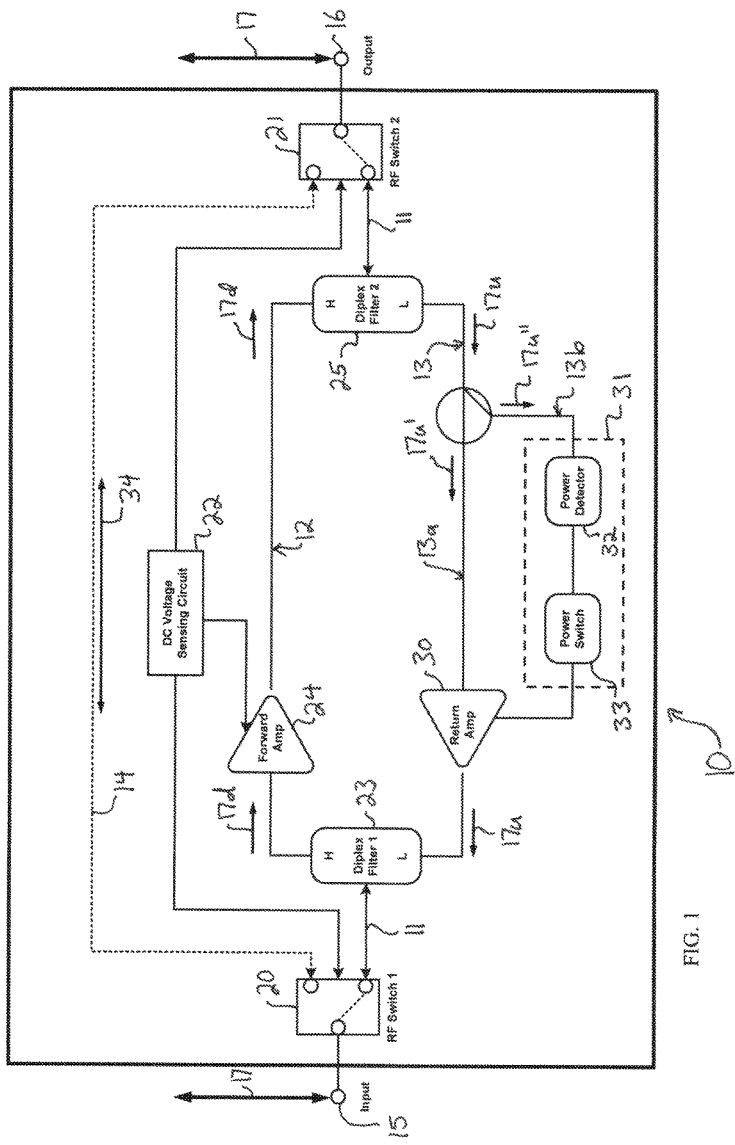
FIG. 1 is a block diagram of a return path noise reducing amplifier with a bypass signal path constructed and arranged in accordance with the principle of the invention, and placed in a normal configuration.
Figure 2:
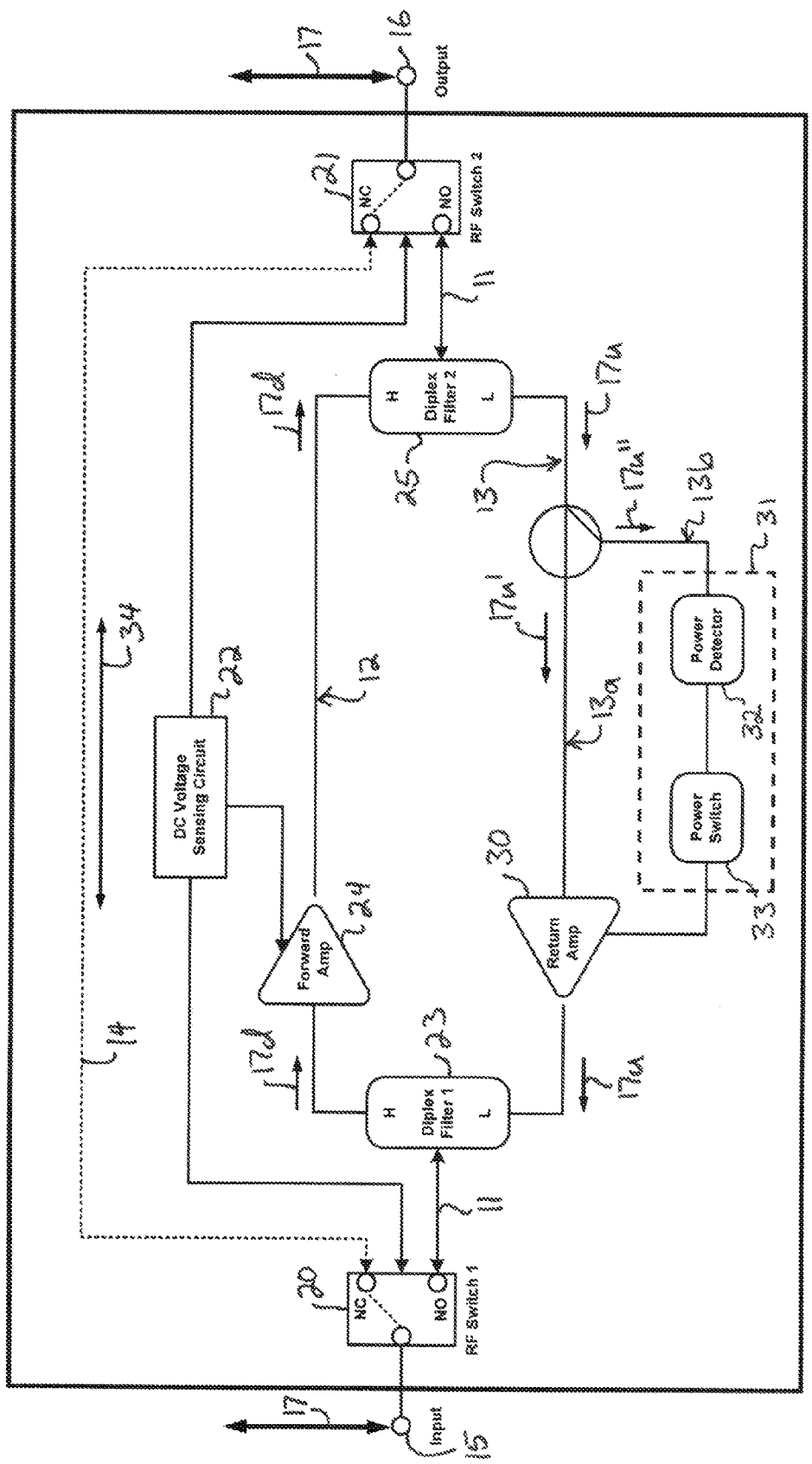
FIG. 2 is a block diagram similar to FIG. 1, illustrating the return path noise reducing amplifier with the bypass signal path placed in a bypass configuration.

Reference now is made to the drawings, in which the same reference characters are used throughout the different figures to designate the same elements. Attention is first directed to FIGS. 1 and 2, which illustrate an amplifier system 10 constructed and arranged in accordance with the present invention, which is useful for delivering diverse communications services. The amplifier system 10 receives communications services from an HFC plant and communicates those services onward to electronic devices installed in a subscriber's home. FIG. 1 illustrates the system 10 in a normal condition, providing full communication services to the home of the subscriber, and FIG. 2 illustrates the system 10 in a drop or bypass condition, providing reduced but uninterrupted communication services to the home of the subscriber. In the normal condition, the system 10 routes data through an amplified path 11 which includes an amplified forward circuit 12 for the transmission of downstream data, and a return circuit 13 for the transmission of upstream data. In the bypass condition, the system 10 routes both downstream and upstream data through a bypass path 14 which is not amplified.

The system 10 includes an input 15 and an output 16. The input 15 is a node operably coupled to the HFC plant providing data communication, such as through an RF signal 17, to the system 10 for delivery to the subscriber's home. The output 16 is a node operably coupled to electronic devices in the subscriber's home, such as coaxial inputs, cable boxes, DVRs, or the like, and one having skill in the art will readily appreciate the output 16 may have one or multiple interfaces allowing the subscriber to couple one or multiple electronic devices to the system 10. Further, although identified as an "input" 15 and an "output" 16, the RF signal 17 moves both upstream and downstream through both of the input 15 and output 16. For purposes of convenience of reference in this description, signals transmitted from the input 15 to the output 16 (or in that direction) will be referred to as downstream signals or as moving in a downstream direction, and signals transmitted from the output 16 to the input 15 (or in that direction) will be referred to as upstream signals or as moving in an upstream direction.

The RF signal 17 to the system 10 is routed through the input 15 to a first bypass switch 20. The first bypass switch 20 defines a component of a switching means for controlling routing of the RF signal 17 through the system 10. The switching means also includes a second bypass switch 21 coupled to the output 16, a DC voltage sensing circuit 22, as well as power detection circuitry 31. The DC voltage sensing circuit 22 senses and detects the current and voltage in the system 10 as will be described later. In response to the DC voltage sensing circuit 22 detecting that the current and voltage supply in the amplified forward circuit 12 of the amplified path 11 is in a normal condition, the first and second bypass switches 20 and 21 place the system 10 in the normal configuration thereof, by routing the RF signal 17 downstream through the amplified forward circuit 12 and upstream through the return circuit 13. In this normal configuration, the first bypass switch 20 is set to pass the RF signal 17 through the amplified path 11 to a first diplex filter 23, which is electrically coupled to the first bypass switch 20 through a normally open contact in the first bypass switch 20, as seen in FIG. 1. The first diplex filter 23 separates the signal in the amplified path 11 into a component downstream signal 17d, operating between approximately 54 MHz and approximately 1002 MHz and transmitted downstream by the HFC plant, and a component upstream signal 17u, operating between approximately 5 MHz and approximately 42 MHz and transmitted upstream from the subscriber's home and electronic devices therein.

As part of the amplified path 11, both the amplified forward circuit 12 and the return circuit 13 include amplifiers to compensate for losses incurred in transmission through the system 10 and in transmission to and from the HFC plant and the subscriber's home. The amplified forward circuit 12 includes a forward amplifier 24, which is a high frequency amplifier for carrying the high frequency downstream signal 17d, and is coupled in electrical communication with the first diplex filter 23. The downstream signal 17d passes through the forward amplifier 24, at which the power of the downstream signal 17d is amplified, to a second diplex filter 25, and then to a normally open contact in the second bypass switch 21. From the second bypass switch 21, the downstream signal 17d is transmitted to the output 16 in the system 10 and on to electronic devices within the subscriber's home. As such, when the system 10 is running in a normal configuration because the current and voltage in the amplified forward circuit 12 are in a normal condition, as shown in FIG. 1, the HFC plant transmits the RF signal 17 to the system 10, through the input 15, the first bypass switch 20, the first diplex filter 23, the forward amplifier 24, the second diplex filter 25, the second bypass switch 21, and out the output 16 to the subscriber's electronic devices. The amplified forward circuit 12 may also include suitable filters, regulators, or other devices for adjusting the downstream signal 17d as desired.

The upstream signal 17u is also transmitted through the system 10 as part of the bidirectional RF signal 17. The upstream signal 17u provides data and information about the electronic devices in the subscriber's home to the HFC plant. The RF signal 17 passes from the subscriber's electronic devices to the output 16 and the second bypass switch 21, and through the normally open contact in the second bypass switch 21 to the second diplex filter 25 where the upstream signal 17u is filtered and transmitted to the return circuit 13. The return circuit 13 includes first and second branches 13a and 13b. The first branch 13a includes a return amplifier 30, and the second branch 13b includes the power detection circuitry 31. The power detection circuity 31 provides power to the return amplifier 30 in response to the power detection circuity 31 detecting a normal condition in the return circuit 13. Conversely, the power detection circuity 31 removes the provision of power to the return amplifier 30 in response to the power detection circuity 31 detecting an abnormal condition in the return circuit 13, as will be explained.

In the return circuit 13, the upstream signal 17u is split into a first component signal 17u' transmitted through the first branch 13a of the return circuit 13 and a a second component signal 17u'' transmitted through the second branch 13b of the return circuit 13 through the power detection circuitry 31. The signals 17u, 17u', and 17u'' are identical, and thus, detection of characteristics of the signal 17u'' is a proxy for detection of characteristics of the signal 17u', and indeed, of the upstream signal 17u as well. The power detection circuity 31 includes a power detector 32 for detecting the power in the signal 17u'', and thus the power in the signals 17u and 17u' as well. The power detection circuity 31 also includes a power switch 33 which moves between on and off conditions, and which is coupled in electrical communication to the power detector 32 and to the return amplifier 30 to provide power to the return amplifier 30 in response to the power detector detecting a normal condition in the return circuit 13 and to remove power to the return amplifier 30 in response to the power detector detecting an abnormal condition in the return circuit 13.

In the normal condition of the return circuit 13, the upstream signal 17u is present and has an amplitude great enough to overcome noise in the upstream signal 17u such that an acceptable SNR is achieved. When the upstream signal 17u is present in the return circuit 13 and has an amplitude above a threshold preselected for the application, such as will occur when a subscriber's electronic device is transmitting information back to the HFC plant, then the power detector 32 detects the presence of the signal 17u". In response, the power switch 33 moves into the on position and provides power to the return amplifier 30, so that the signal 17u is conditioned and amplified, then transmitted to the first diplex filter 23, then to the normally open contact in the first bypass switch 20, and finally to the input 15 for transmission out of the system 10 and back to the HFC plant.

The power switch 33 moves into the off condition when the power detector 32 detects that the signal 17u' has an amplitude less than the predetermined threshold. When the signal 17u" has an amplitude less than the predetermined threshold, or when there is no signal 17u" at all, it is because the electronic devices in the subscriber's home are not transmitting data back to the HFC plant, and so the return circuit 13 is considered to carry only ingress noise, which need not be passed to the HFC plant. This defines the abnormal condition of the return circuit 13. As such, the power switch 33 moves to the off position, decoupling the return amplifier 30 from its power source and preventing the upstream transmission of the upstream signal 17u from the subscriber's home.

In the event of a loss or disruption of power, the system 10 moves from the normal condition, in which the RF signal 17 is routed through the amplified path 11, to the bypass condition, in which the RF signal 17 is routed through the bypass path 14. In the bypass condition of the system 10, the uninterrupted transmission of upstream and downstream data is preserved through the system 10.

FIG. 2 illustrates the system 10 arranged in the bypass condition thereof with the RF signal 17 routed through the bypass path 14. The bypass path 14 includes the DC voltage sensing circuit 22, which is a separate circuit from the amplified forward circuit 12, but is coupled in electrical communication to the amplified forward circuit 12. The DC voltage sensing circuit 22 is electrically coupled to the forward amplifier 24 to monitor the voltage at the forward amplifier 24 and thus in the amplified forward circuit 24. The voltage at the forward amplifier 24 is sampled, filtered, and scaled by the DC voltage sensing circuit 22 and then compared to a predetermined reference voltage threshold. If the scaled voltage is equal to or greater than the predetermined reference voltage threshold, then the DC voltage sensing circuit 22 detects that the forward amplifier 24 is operating in a normal condition at an acceptable voltage. In response, the DC voltage sensing circuit 22 issues a signal to the first and second bypass switches 20 and 21 to route, or continue to route, the RF signal 17 along the amplified path 11 through the first and second diplex filters 23 and 25, as in FIG. 1. If, however, the scaled voltage is less than the predetermined reference voltage threshold, then the DC voltage sensing circuit 22 detects that the forward amplifier 24, and thus the amplified forward circuit 12, is below the acceptable reference voltage threshold, or possibly without power at all. In response, the DC voltage sensing circuit 22 issues a signal to the first and second bypass switches 20 and 21 to route the RF signal 17 along the bypass path 14 through the normally closed contacts of the first and second bypass switches 20 and 21. When the first and second bypass switches 20 and 21 pass the RF signal 17 to the bypass path 14, the amplified path 11, the first diplex filter 23, the forward amplifier 24, the second diplex filter 25, the power detection circuitry 31, and the return amplifier 30 are all electrically isolated from the bypass path 13. A bypass signal 34 is provided through the bypass path 14 between the input 15 and the output 16, through the first and second bypass switches 20 and 21, for transmission to and from the subscriber's electronic devices. Upstream and downstream VoIP services provided through the system 10 are thus maintained, despite the loss of power to the system 10.

Figure 3:
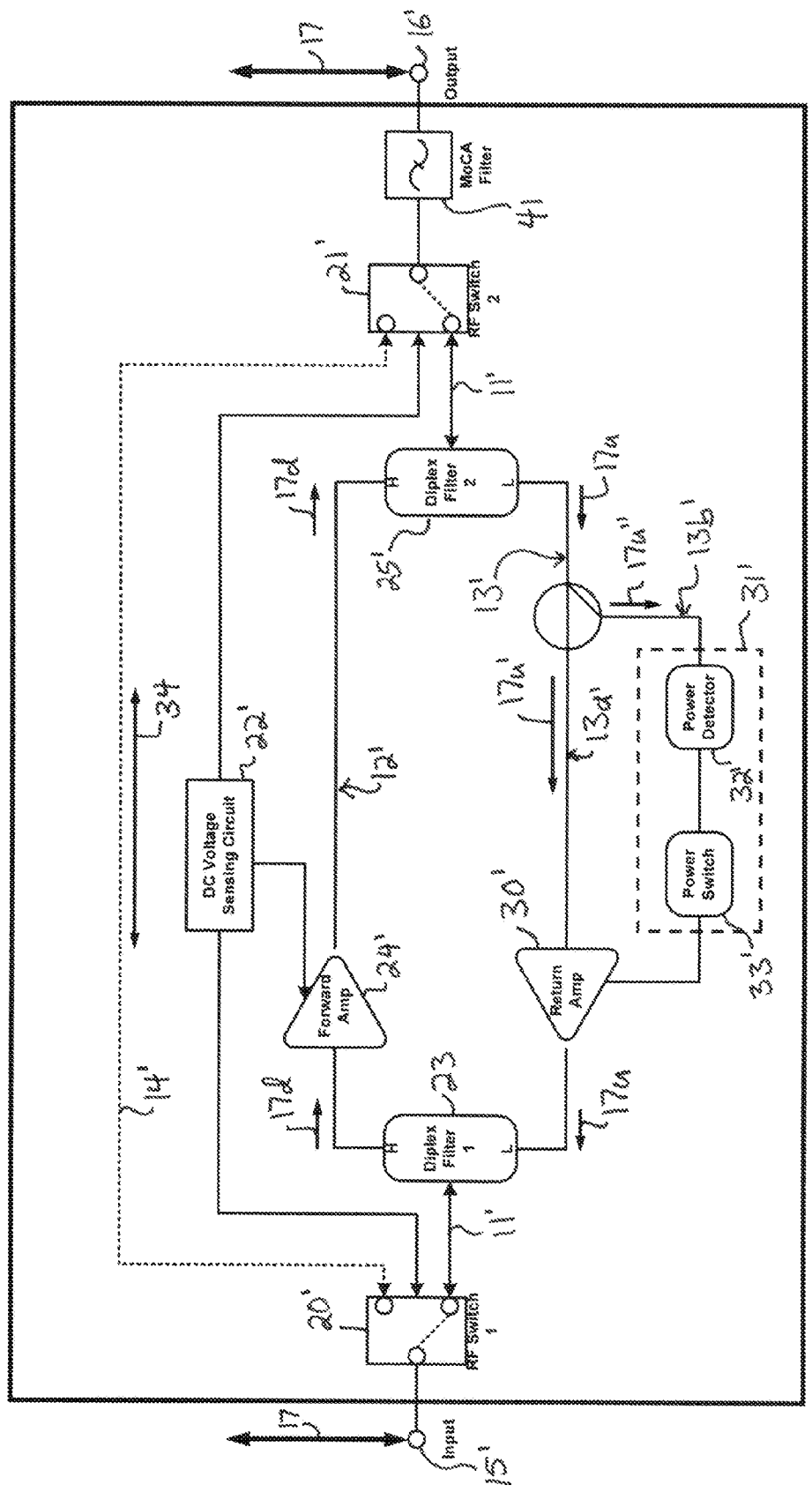
FIG. 3 is a block diagram of an alternate embodiment of a return path noise reducing amplifier with a bypass signal path, including an additional downstream filter.

An alternate embodiment of the amplifier system is shown in FIG. 3 and is identified with the reference character 40. The system 40 is identical to the system 10 in that it receives communications services from an HFC plant and communicates those services onward to electronic devices installed in a subscriber's home, and also returns information to the HFC plant from the home. The system 40 is identical to the system 10 in nearly every respect, and the reference characters used to describe and indicate the various structural features and elements of the system 10 are also used to describe and indicate identical respective reference characters of the system 40, but are designated with a prime ("'") symbol so as to distinguish the structural features and elements of the system 40 from those of the system 10. Accordingly, the system 40 includes an amplified path 11', amplified forward circuit 12', return circuit 13', first branch 13a', second branch 13b', bypass path 14', input 15', output 16', first bypass switch 20', second bypass switch 21', DC voltage sensing circuit 22, first diplex filter 23', forward amplifier 24', second diplex filter 25', return amplifier 30', power detection circuitry 31', power detector 32', power switch 33', bypass signal 34'. The various signals throughout the system 40 are marked with the identical reference characters as those of the system 10, such as RF signal 17, component downstream signal 17d, component upstream signal 17u, first and second component signal 17u' and 17u", and bypass signal 34. Coupled in electrical communication between the second bypass switch 21' and the output 16' is a filter 41. The filter 41 passes a band of the RF signal 17 in the downstream direction from the input 15' to the output 16' in the range of approximately 5 MHz to approximately 1002 MHz. The filter 41 filters a band of the RF signal 17 in the upstream direction from the output 16' to the input 15' in the range of approximately 1125 MHz to approximately 1525 MHz. The insertion loss, or rejection, of the filter 41 from 1125 MHz to 1525 MHz is more than 40 dB.

The present invention is described above with reference to a preferred embodiment. However, those skilled in the art will recognize that changes and modifications may be made in the described embodiment without departing from the nature and scope of the present invention. To the extent that such modifications and variations do not depart from the spirit of the invention, they are intended to be included within the scope thereof.

Having fully and clearly described the invention so as to enable one having skill in the art to understand and practice the same, the invention claimed is:

1. An amplifier system for communicating an RF signal, the system comprising:
   an amplified path including an amplified forward circuit for communicating the RF signal downstream;
   a return path for communicating the RF signal upstream;

a bypass path configured to communicate the RF signal upstream and downstream through the system;

switching means coupled to the amplified, return, and bypass paths, wherein the switching means includes a first switch, a second switch, and a DC voltage sensing circuit coupled in electrical communication to the amplified path to detect voltage in the amplified path and not coupled in electrical communication to the return path;

wherein the switching means communicates the RF signal downstream through the amplified path in response to a normal condition in the amplified path, and communicates the RF signal through the bypass path in response to an abnormal condition in the amplified path; and the switching means provides power to the return path in response to a normal condition in the return path, and removes power from the return path in response to an abnormal condition in the return path.

2. The system of claim 1, wherein the switching means further includes
detection circuitry coupled in electrical communication to the return path to detect power in the return path.

3. The system of claim 2, wherein a return amplifier in the return path receives power from the detection circuitry in response to the detection circuitry detecting power in the return path.

4. The system of claim 1, further including a filter, wherein:
the filter is configured to filter a band of the RF signal in the return path in a range from 1125 MHz to 1525 MHz; and
the filter is configured to pass a band of the RF signal downstream in a range from 5 MHz to 1002 MHz.

5. An amplifier system for communicating an RF signal, the system comprising:
an amplified path including an amplified forward circuit and a return circuit including power detection circuitry to provide power to the return circuit in response to a normal condition in the return circuit, and to remove power from the return circuit in response to an abnormal condition in the return circuit;
a DC voltage sensing circuit coupled in electrical communication to the forward circuit to detect voltage in the forward circuit and not coupled in electrical communication to the return circuit;
a bypass path; and
a switch coupled in electrical communication to the amplified and bypass paths to route the RF signal through the amplified path in response to a normal condition in the amplified path, and to route the RF signal through the bypass path in response to an abnormal condition in the amplified path.

6. The system of claim 5, further comprising:
the DC voltage sensing circuit detects voltage above a threshold value in the normal condition of the amplified path; and
the DC voltage sensing circuit detects voltage below a threshold value in the abnormal condition of the amplified path.

7. The system of claim 6, wherein the switch is coupled in electrical communication to the DC voltage sensing circuit to route the RF signal through the amplified path in response to the DC voltage sensing circuit detecting voltage above the threshold value, and to route the RF signal through the bypass path in response to the DC voltage sensing circuit detecting voltage below the threshold value.

8. The system of claim 5, wherein the return circuit includes a return amplifier.

9. The system of claim 8, wherein the power detection circuitry comprises:
a power detector configured to detect power in the return circuit;
a power switch coupled in electrical communication to the power detector and coupled in electrical communication to the return amplifier to provide power to the return amplifier;
the power switch provides power to the return amplifier in response to the power detector detecting power in the return circuit; and
the power switch removes power to the return amplifier in response to the power detector failing to detect power in the return circuit.

10. The system of claim 5, further including a filter, wherein:
the filter is configured to filter a band of the RF signal in the return circuit in a range from 1125 MHz to 1525 MHz; and
the filter is configured to pass a band of the RF signal downstream in a range from 5 MHz to 1002 MHz.

11. An amplifier system for communicating an RF signal, the system comprising:
an input connector for receiving the RF signal from a plant and returning the RF signal to the plant;
an output connector adapted for connection to telecommunication equipment;
an amplified path connecting the input connector to the output connector, the amplified path including:
a first diplex filter for separating the RF signal into downstream and upstream signals;
an amplified forward circuit for amplifying the downstream signal;
a return circuit for the upstream signal; and
a second diplex filter for combining the downstream and upstream signals;
a bypass path connecting the input connector to the output connector, the bypass path including a DC voltage sensing circuit coupled in electrical communication to the amplified path to detect voltage in the amplified path and not coupled in electrical communication to the return circuit;
a switch coupled in electrical communication between the input and output connectors to route the RF signal through one of the amplified path and bypass path; and
the switch is coupled in electrical communication to the DC voltage sensing circuit for routing the RF signal through the amplified path in response to the DC voltage sensing circuit detecting a normal condition in the amplified path and for routing the RF signal through the bypass path in response to the DC voltage sensing circuit detecting an abnormal condition in the amplified path;
wherein the return circuit of the amplified path includes:
a return amplifier;
power detection circuitry coupled in electrical communication to the return amplifier;
the power detection circuitry provides power to the return amplifier in response to the power detection circuitry detecting a normal condition in the return circuit; and
the power detection circuitry removes power to the return amplifier in response to the power detection circuitry detecting an abnormal condition in the return circuit.

12. The amplifier system of claim 11, wherein the normal condition in the amplified path exists when the amplified path has a characteristic above a threshold value.

13. The amplifier system of claim 12, wherein the characteristic is voltage and the threshold value is a predetermined voltage in the amplified path.

14. The amplifier system of claim 11, wherein the abnormal condition in the amplified path exists when the amplified path has a characteristic below a threshold value.

15. The amplifier system of claim 14, wherein the characteristic is voltage and the threshold value is a predetermined voltage in the amplified path.

16. The amplifier system of claim 11, wherein the normal condition in the return circuit exists when only noise is transmitted along the return circuit by telecommunication equipment coupled to the output connector.

17. The amplifier system of claim 11, wherein the abnormal condition in the return circuit exists when no signal is transmitted along the return circuit by telecommunication equipment coupled to the output connector.

18. The amplifier system of claim 11, wherein the power detection circuitry comprises:

a power detector configured to detect power in the return circuit;

a power switch coupled in electrical communication to the power detector and coupled in electrical communication to the return amplifier to provide power to the return amplifier;

the power switch provides power to the return amplifier in response to the power detector detecting power in the return circuit; and the power switch removes power to the return amplifier in response to the power detector failing to detect power in the return circuit.

19. The system of claim 11, further including a filter, wherein:

the filter is configured to filter a band of the RF signal in the return circuit in a range from 1125 MHz to 1525 MHz; and the filter is configured to pass a band of the RF signal downstream in a range from 5 MHz to 1002 MHz.

\* \* \* \* \*